US008796107B2

(12) United States Patent
Ahn et al.

(10) Patent No.: US 8,796,107 B2
(45) Date of Patent: Aug. 5, 2014

(54) METHODS FOR FABRICATING SEMICONDUCTOR DEVICES

(71) Applicant: Samsung Electronics Co., Ltd., Gyeonggi-do (KR)

(72) Inventors: Kevin Ahn, Chungcheongnam-do (KR); Bo-Un Yoon, Seoul (KR); Jeong-Nam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/679,345

(22) Filed: Nov. 16, 2012

(65) Prior Publication Data

US 2013/0137240 A1    May 30, 2013

(30) Foreign Application Priority Data

Nov. 28, 2011   (KR) .................. 10-2011-0125108

(51) Int. Cl.
    *H01L 21/762*    (2006.01)
    *H01L 21/311*    (2006.01)
    *H01L 21/336*    (2006.01)
    *H01L 21/02*     (2006.01)
    *H01L 21/306*    (2006.01)
    *H01L 29/66*     (2006.01)
    *H01L 21/04*     (2006.01)

(52) U.S. Cl.
    CPC ...... *H01L 21/76229* (2013.01); *H01L 21/0206* (2013.01); *H01L 21/31111* (2013.01); *H01L 21/30604* (2013.01); *H01L 21/30621* (2013.01); *H01L 29/66545* (2013.01); *H01L 21/0475* (2013.01); *H01L 21/76205* (2013.01)
    USPC ........... 438/427; 438/296; 438/706; 438/734; 257/E21.546

(58) Field of Classification Search
    CPC .................. H01L 21/76229; H01L 21/02065; H01L 21/31111
    USPC ........... 438/427, 296, 706, 734; 257/E21.546
    See application file for complete search history.

(56) References Cited

U.S. PATENT DOCUMENTS

| 6,335,287 | B1 | 1/2002 | Hwang et al. |
| 6,569,747 | B1 | 5/2003 | Achuthan et al. |
| 6,613,646 | B1 | 9/2003 | Sahota et al. |
| 7,361,565 | B2* | 4/2008 | Shin et al. ................. 438/303 |

(Continued)

FOREIGN PATENT DOCUMENTS

| JP | 2001-057382 | 2/2001 |
| JP | 2002-026117 | 1/2002 |

(Continued)

*Primary Examiner* — Colleen Matthews
*Assistant Examiner* — Regan J Rundio
(74) *Attorney, Agent, or Firm* — Myers Bigel Sibley & Sajovec, P.A.

(57) ABSTRACT

Provided are methods for fabricating a semiconductor device. The methods include forming a hard mask pattern on a semiconductor substrate, forming a first trench having a first width and a second trench having a second width on the semiconductor substrate using the hard mask pattern as a mask, forming an oxide film on the hard mask pattern and the first and second trenches, forming first and second isolation films on the first and second trenches by planarizing the oxide film until the hard mask pattern is exposed, and etching the first isolation film by a first thickness by performing dry cleaning on the semiconductor substrate and etching the second isolation film by a second thickness different from the first thickness.

10 Claims, 12 Drawing Sheets

(56) References Cited

U.S. PATENT DOCUMENTS

| | | | |
|---|---|---|---|
| 8,187,486 B1 * | 5/2012 | Liu et al. | 216/79 |
| 2007/0298584 A1 * | 12/2007 | Tokuichi | 438/427 |
| 2008/0171438 A1 * | 7/2008 | Sinha et al. | 438/689 |
| 2008/0280418 A1 * | 11/2008 | Wang et al. | 438/435 |
| 2009/0008700 A1 * | 1/2009 | Fayrushin et al. | 257/321 |
| 2009/0020847 A1 * | 1/2009 | Byun et al. | 257/510 |
| 2009/0111240 A1 | 4/2009 | Hashimoto | |
| 2009/0275205 A1 * | 11/2009 | Kiehlbauch et al. | 438/712 |
| 2010/0237046 A1 * | 9/2010 | Kent et al. | 216/58 |
| 2010/0320544 A1 * | 12/2010 | Tseng et al. | 257/380 |

FOREIGN PATENT DOCUMENTS

| | | |
|---|---|---|
| JP | 2006-032700 | 2/2006 |
| JP | 2006-351747 | 12/2006 |
| JP | 2007-073899 | 3/2007 |
| KR | 1020040110792 A | 12/2004 |
| KR | 1020050012650 A | 2/2005 |
| KR | 1020060074506 A | 7/2006 |
| KR | 1020060075104 A | 7/2006 |

* cited by examiner (T2 > T1)

(T2 > T1)

(T3 > T4)

METHODS FOR FABRICATING SEMICONDUCTOR DEVICES

CROSS-REFERENCE TO RELATED APPLICATION

This application claims priority from Korean Patent Application No. 10-2011-0125108 filed on Nov. 28, 2011 in the Korean Intellectual Property Office, under 35 U.S.C. §119, the contents of are incorporated herein by reference in its entirety.

FIELD OF THE INVENTION

The present invention relates to methods for fabricating a semiconductor device.

BACKGROUND

As a variety of semiconductor devices have been gaining attention, devices formed on a semiconductor substrate are becoming varied. The devices formed on the semiconductor substrate may be isolated from each other by, for example, an isolation film. As the devices formed on a semiconductor substrate are becoming varied, shapes of the isolation film are also becoming varied. If the device and isolation film having modified shapes are formed on the semiconductor substrate in a conventional manner, unexpected problems may occur.

SUMMARY

The present invention provides methods for fabricating a semiconductor device, which can produce a semiconductor device having improved product reliability.

According to an aspect of the present invention, there is provided a method for fabricating a semiconductor device, the method including forming a hard mask pattern on a semiconductor substrate, forming a first trench having a first width and a second trench having a second width on the semiconductor substrate using the hard mask pattern as a mask, forming an oxide film on the hard mask pattern and the first and second trenches, forming first and second isolation films on the first and second trenches by planarizing the oxide film until the hard mask pattern is exposed, and etching the first isolation film by a first thickness by performing dry cleaning on the semiconductor substrate and etching the second isolation film to have a second thickness different from the first thickness.

According to another aspect of the present invention, there is provided a method for fabricating a semiconductor device, the method including forming a first isolation film having a first width and a second isolation film having a second width on a semiconductor substrate having a buffer oxide film pattern and a hard mask film pattern, etching the first and second isolation films to have first and second thicknesses different from each other in the course of performing dry cleaning on the semiconductor substrate, etching the first and second isolation films to have third and fourth thicknesses different from each other in the course of exposing an active region of the semiconductor substrate by removing the buffer oxide film pattern and the hard mask film pattern, and forming a metal gate on the exposed active region of the semiconductor substrate.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE EMBODIMENTS

Figure 1:
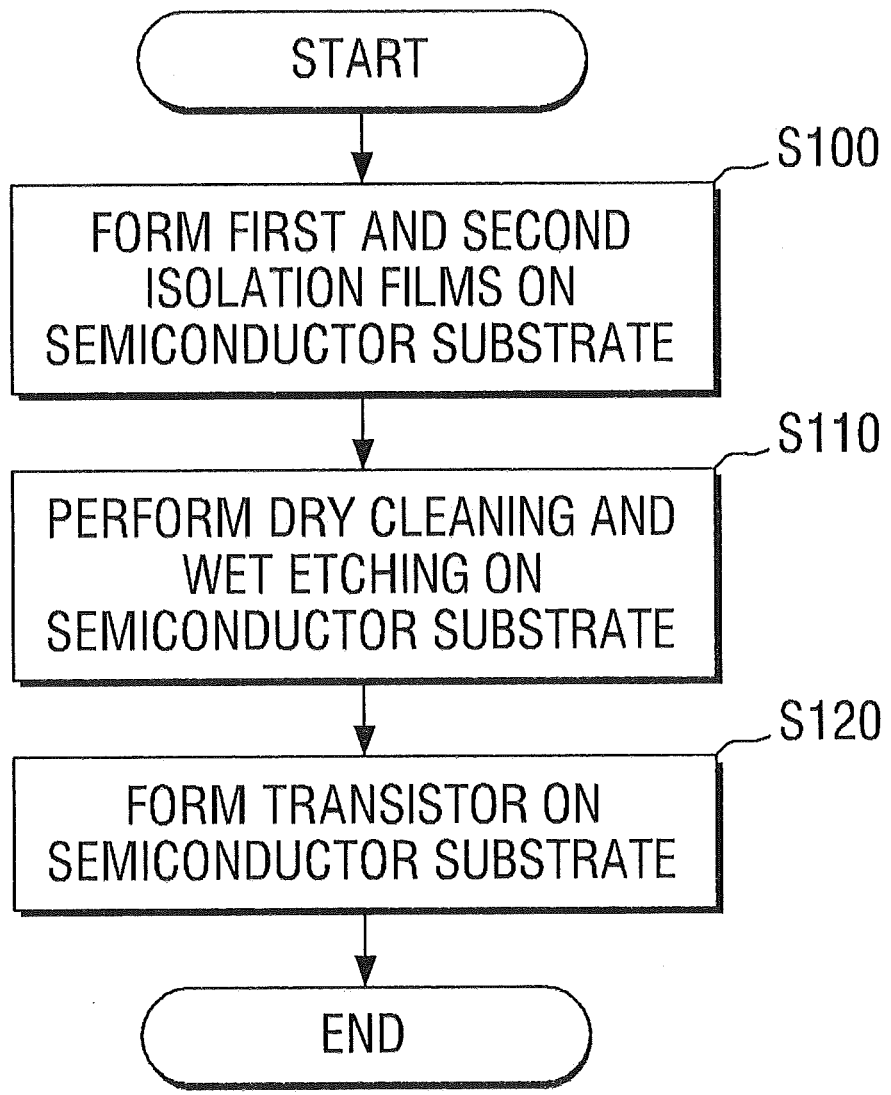
FIG. 1 is a flowchart of a method for fabricating a semiconductor device according to an embodiment of the present invention.

The above and other objects of the present invention will be described in or be apparent from the following description of the various embodiments.

In particular, advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

FIG. 1 is a flowchart of a method for fabricating a semiconductor device according to an embodiment of the present invention and FIGS. 2 through 13 illustrate intermediate process steps for describing the method for fabricating a semiconductor device shown in FIG. 1.

First, referring to FIG. 1, first and second isolation films are formed on a semiconductor substrate (S100), which will now be described in more detail with reference to FIGS. 2 through 5.

Figure 2:
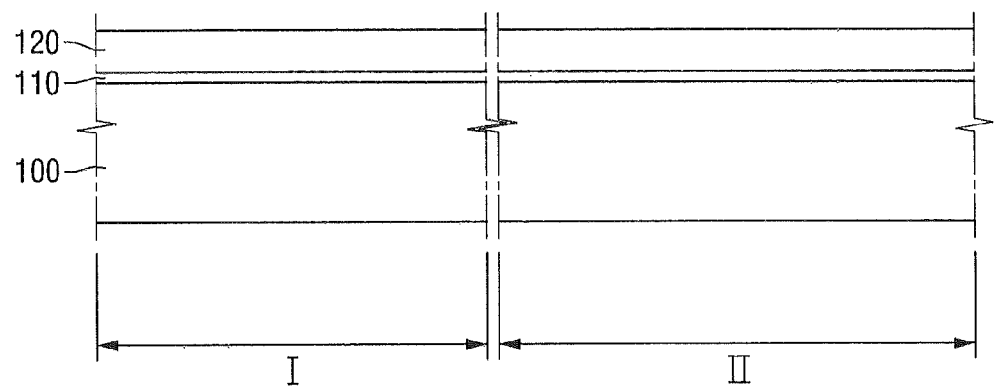
FIGS. 2 through 13 illustrate intermediate process steps for describing the method for fabricating a semiconductor device shown in FIG. 1.

Referring to FIG. 2, a buffer oxide film 110 and a hard mask film 120 are sequentially formed on the semiconductor substrate 100.

The semiconductor substrate 100 may include, for example, a bulk silicon substrate, a silicon-on-insulator (SOI) substrate, a germanium substrate, a germanium-on-insulator (GOI) substrate, a silicon-germanium substrate, or an epitaxial film substrate obtained by performing selective epitaxial growth (SEG).

In the illustrated embodiment, the hard mask film 120 may be a silicon nitride (SiN) film. As will later be described, since the hard mask film 120 is used in etching the semiconductor substrate 100, it may include a harder material than the semiconductor substrate 100.

Figure 3:
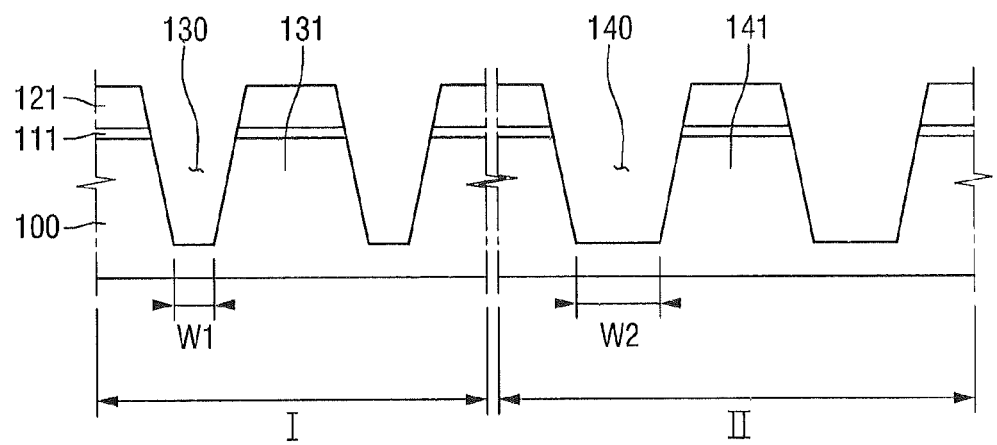

Next, referring to FIG. 3, a mask pattern (not shown) is formed on the hard mask film 120, and the hard mask film 120 is etched using the formed mask pattern (not shown). As a result, as shown in FIG. 3, a hard mask pattern 121 is formed.

When a hard mask pattern 121 is formed, the buffer oxide film 110 and the semiconductor substrate 100 may be etched using the hard mask pattern 121 as a mask. Accordingly, the buffer oxide film 110 becomes a buffer oxide film pattern 111, and trenches 130 and 140 are formed in the semiconductor substrate 100. Once the trenches 130 and 140 are formed in the semiconductor substrate 100, active regions 131 and 141 are defined at both sides of the trenches 130 and 140.

Meanwhile, in the illustrated embodiment, the trenches 130 and 140 formed in the semiconductor substrate 100 may have different widths. In detail, the first trench 130 formed in a first region I of the semiconductor substrate 100 may have a first width W1, and the second trench 140 formed in a second region II of the semiconductor substrate 100 may have a second width W2. Here, the first width W1 and the second width W2 may be different from each other. In particular, in the illustrated embodiment, the second width W2 may be greater than the first width W1.

That is, the semiconductor substrate 100 may be etched using the hard mask pattern 121 as a mask, thereby forming a plurality of first trenches 130 each having the first width W1 in the first region I of the semiconductor substrate 100 and a plurality of second trenches 140 each having the second width W2 greater than the first width W1 in the second region II.

Figure 4:
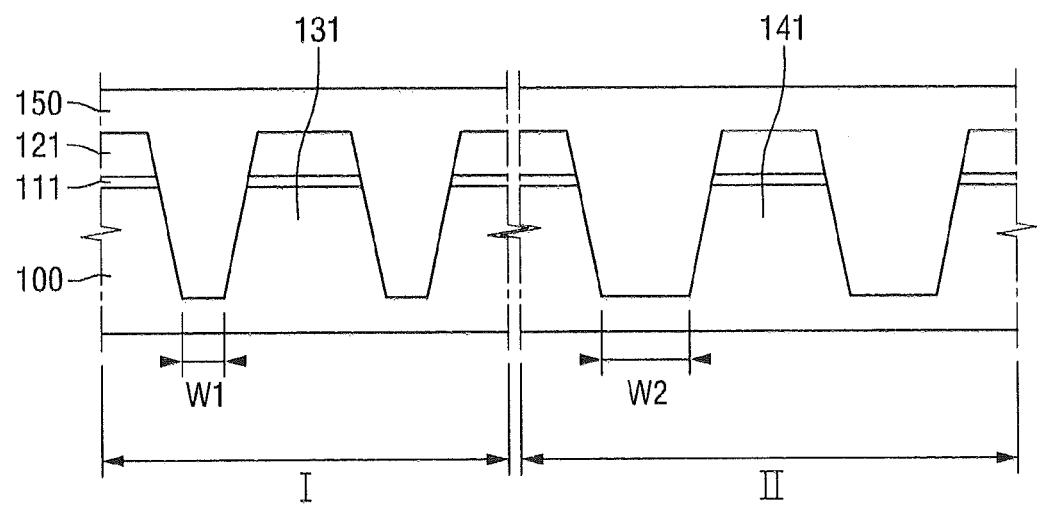

Next, referring to FIG. 4, an oxide film 150 is formed on the hard mask pattern 121 and the first and second trenches (130 and 140 of FIG. 3). As a result, a top portion of the hard mask pattern 121 is covered by the oxide film 150. In the illustrated embodiment, the oxide film 150 may be, for example, an undoped silicate glass (USG) oxide film, but not limited thereto.

Figure 5:
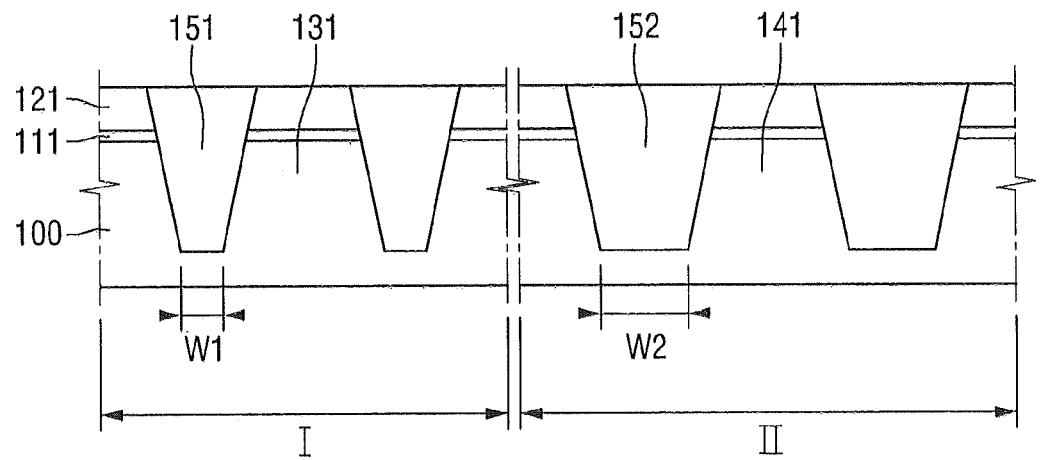

Referring to FIG. 5, the oxide film (150 of FIG. 4) is planarized until the hard mask pattern 121 is exposed. Accordingly, as shown in FIG. 5, a first isolation film 151 having the first width W1 may be formed in the first region I of the semiconductor substrate 100, and a second isolation film 152 having the second width W2 greater than the first width W1 may be formed in the second region II. Although not shown herein, a residue of the oxide film 150 that is not completely removed may remain on the hard mask pattern 121.

Referring again to FIG. 1, the semiconductor substrate 100 is dry cleaned and wet etched (S110), which will now be described in more detail with reference to FIGS. 6 through 8.

Figure 6:
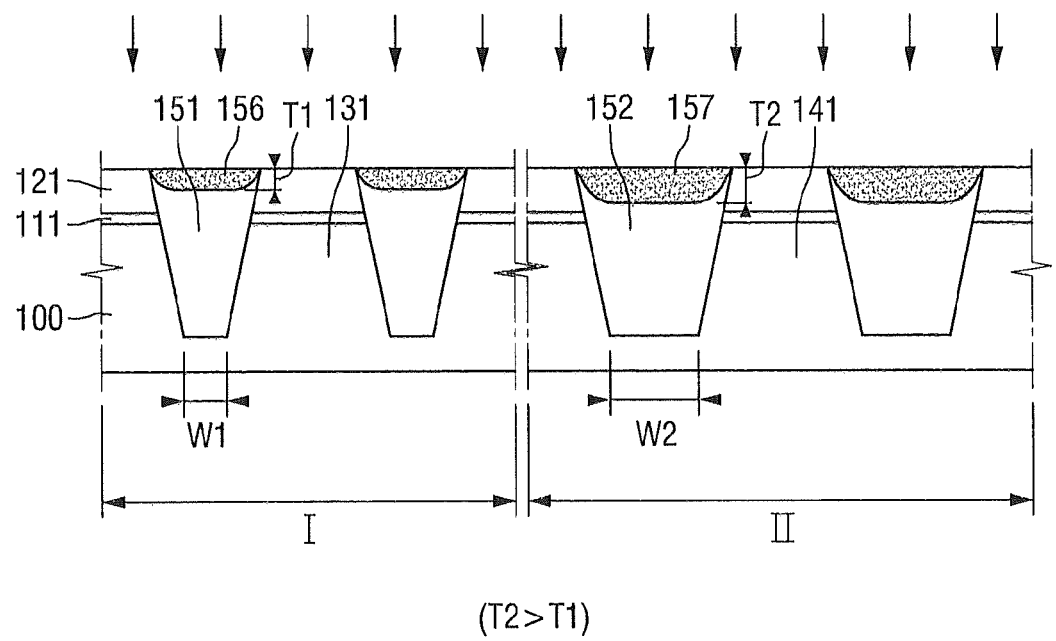

Referring to FIG. 6, an etching gas, a catalytic gas and an inert gas are injected into a chamber without a bias applied thereto. Here, the etching gas may include, for example, HF gas, the catalyst gas may include, for example, $NH_3$ gas, and the inert gas may include, for example, $N_2$ or Ar gas.

When no bias is applied to the chamber, the semiconductor substrate 100 is placed in the chamber for at least 10 minutes, or in some cases, for a period of time in a range from about 10, 20, 30, 40, 50 or 60 minutes to perform dry cleaning while the chamber is maintained at a temperature ranging from room temperature to 300° C. under the pressure ranging from 0 to 760 Torr.

Once the dry cleaning is performed, the gas in the chamber reacts with the first and second isolation films 151 and 152 to form first and second sacrificial films 156 and 157. In detail, the first sacrificial film 156 having a first thickness T1 is formed in the first isolation film 151 having the relatively small width W1, and the second sacrificial film 157 having a second thickness T2 greater than the first thickness T1 is formed in the second isolation film 152 having the relatively larger width W2. Here, the second sacrificial film 157 that is thicker than the first sacrificial film 156 is formed in the second isolation film 152 having the relatively larger width W2. It is noted that is presumably because the second isolation film 152 is exposed to reactant gases in an increased area. The thus formed first sacrificial film 156 and second sacrificial film 157 may include ammonium-silicon-fluoride (e.g., $(NH_4)_2SiF_6$).

After the first and second sacrificial films 156 and 157 having different thicknesses are formed, they are removed by, for example, baking. Here, formation of the first and second sacrificial films 156 and 157 and removal of the same may be performed in-situ.

Figure 7:
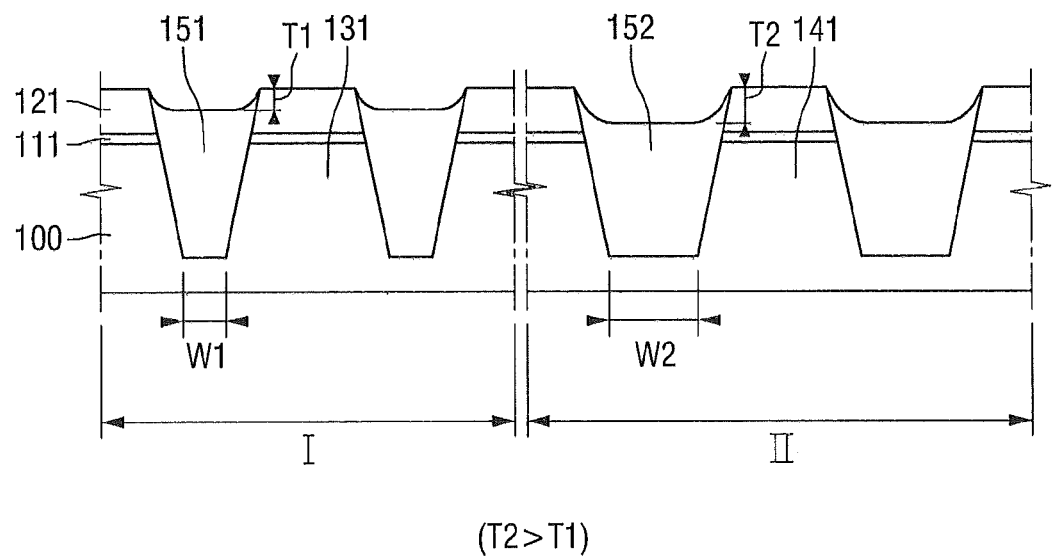

Referring to FIG. 7, since the first and second sacrificial films (156 and 157 of FIG. 6) have been removed from the first and second isolation films 151 and 152, the first and second isolation films 151 and 152 are etched as much as the thicknesses of the first and second sacrificial films (156 and 157 of FIG. 6). In other words, the first isolation film 151 is etched by the first thickness T1 and the second isolation film 152 is etched by the second thickness T2 that is greater than the first thickness T1 through a dry cleaning process. Here, the etched first and second isolation films 151 and 152 may have an isotropic etching profile, as shown in FIG. 7.

Figure 8:
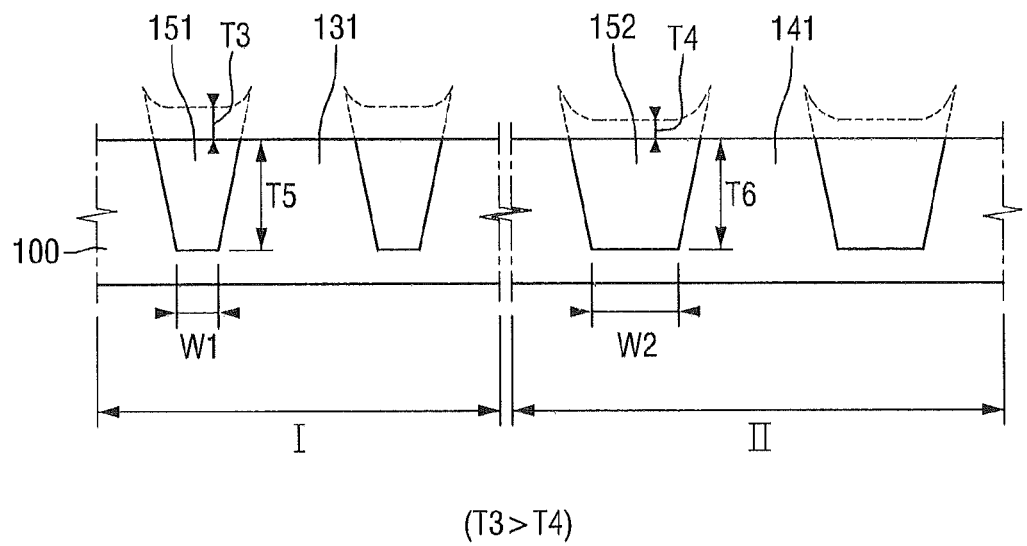

Referring to FIG. 8, the hard mask pattern 121 and the buffer oxide film pattern 111 are wet etched. As described above, a residue of the oxide film (150 of FIG. 4) (not shown) remaining on the hard mask pattern 121, if any, may also be etched.

On detail, first, if there is a residue of the oxide film (150 of FIG. 4) (not shown) remaining on the hard mask pattern 121, the residue is removed by wet etching using a HF solution. Then, the hard mask pattern 121 is removed by wet etching using a phosphoric acid solution. Thereafter, although not shown in detail, wells (not shown) used for the semiconductor substrate 100 are formed by ion implantation. Then, the buffer oxide film pattern 111 is removed by wet etching using a HF solution.

While the films formed on the semiconductor substrate 100 are removed in the above-described manner, the first isolation film 151 and the second isolation film 152 are etched at the same time. In particular, the first isolation film 151 having the smaller width W1 than the second isolation film 152 is etched more than the second isolation film 152 at least due to its structural characteristic. In other words, during the etching process, while the first isolation film 151 is etched by a third thickness T3, the second isolation film 152 is etched by a fourth thickness T4 that is smaller than the third thickness T3.

As will later be described in more detail, in the illustrated embodiment, the second isolation film 152 is etched more thickly than the first isolation film 151 (T2>T1 in FIG. 7) through dry cleaning. Therefore, even if the first isolation film 151 is etched more thickly than the second isolation film 152 (T3>T4) while etching the hard mask pattern 121 and the buffer oxide film pattern 111, etching amounts of the first and second isolation films 151 and 152 are balanced substantially with each other.

If the dry cleaning has not been performed, the first isolation film 151 is etched more thickly than the second isolation film 152 (T3>T4) in etching the hard mask pattern 121 and the buffer oxide film pattern 111. Thus, a step difference may be formed between the second isolation film 152 and an active region 141 adjacent thereto. That is, since the second isolation film 152 may not be etched sufficiently, a thickness T6 of the second isolation film 152 may become greater than a thickness T5 of the first isolation film 151. The consequently formed step difference may cause a problem associated with product reliability in subsequent processes, which will later be described.

Referring again to FIG. 1, a transistor may be formed on the semiconductor substrate (S120), which will now be described in more detail with reference to FIGS. 9 through 11.

Figure 9:
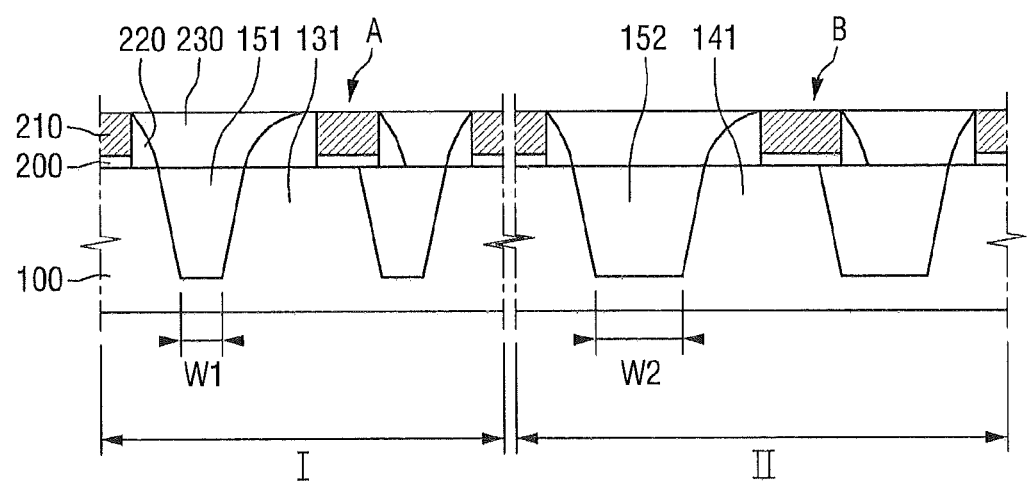

Referring to FIG. 9, an insulation film (not shown) and a conductive film (not shown) are sequentially formed on the semiconductor substrate 100 and patterned to form a gate insulation film 200 and a dummy gate 210 formed on the gate insulation film 200.

Here, the gate insulation film 200 may be formed to have a double layered structure having an interfacial oxide layer (not shown) and a high-k oxide layer (not shown). Examples of materials for forming the interfacial oxide layer may include $SiO_2$ and examples of materials for forming the high-k oxide layer may include $HfO_2$, $Al_2O_3$, $ZrO_2$, and $TaO_2$, but aspects of the present invention are not limited thereto. Meanwhile, the dummy gate 210 may be formed of a conductive material, such as polysilicon (poly-si), but aspects of the present invention are not limited thereto.

In some embodiments, a buffer film (not shown) may be further formed on the dummy gate 210.

After the insulation film 200 and the dummy gate 210 are formed, a spacer 220 may be formed at both sides of the gate insulation film 200 and the dummy gate 210. The spacer 220 may be formed of an insulating material, such as silicon nitride ($SiN_x$) or silicon oxide ($SiO_x$), but aspects of the present invention are not limited thereto.

When necessary, the gate spacer 220 may have a modified shape, for example, an L shape, unlike in FIG. 9. In addition, in some embodiments, when necessary, the gate spacer 220 may not be formed.

After the gate spacer 220 is formed, an interlayer insulation film 230 is formed on the semiconductor substrate 100. In addition, as shown in FIG. 9, the interlayer insulation film 230 is planarized until the dummy gate 210 is exposed. If a buffer film (not shown) has been formed on the dummy gate 210 as described above, the interlayer insulation film 230 may be planarized until the dummy gate 210 is exposed.

Referring again to FIG. 9, some gate insulation films 200 and dummy gates 210 may be formed on active regions 131 and 141 of the semiconductor substrate 100. However, the gate insulation films 200 and the dummy gates 210 may also be formed not only on the active regions 131 and 141 of the semiconductor substrate 100 but also on the first and second isolation films 151 and 152. That is, a first dummy transistor A formed along a top surface of the first isolation film 151 and a top surface of the active region 131 may exist in the first region I of the semiconductor substrate 100, and a second dummy transistor B formed along a top surface of the second isolation film 152 and a top surface of the active region 141 may exist in the second region II of the semiconductor substrate 100.

Figure 10:
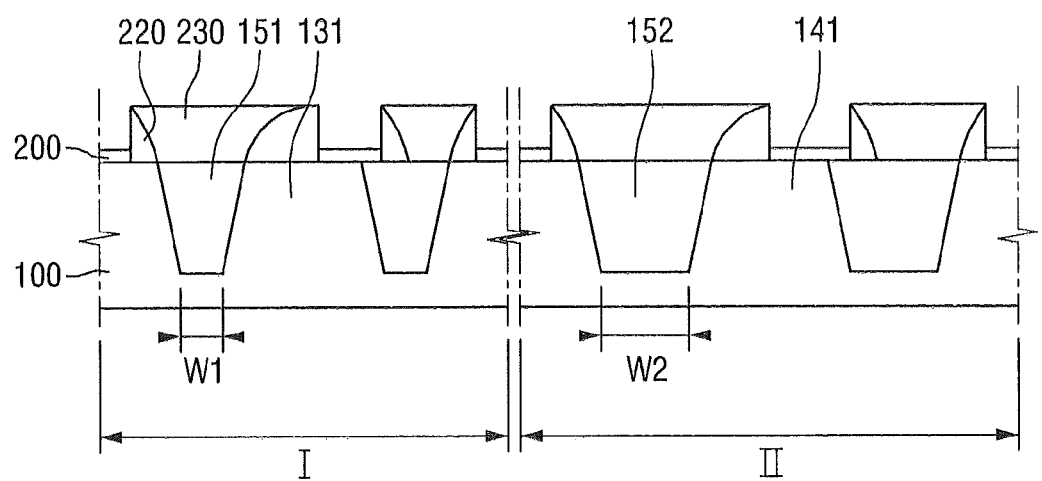
Figure 11:
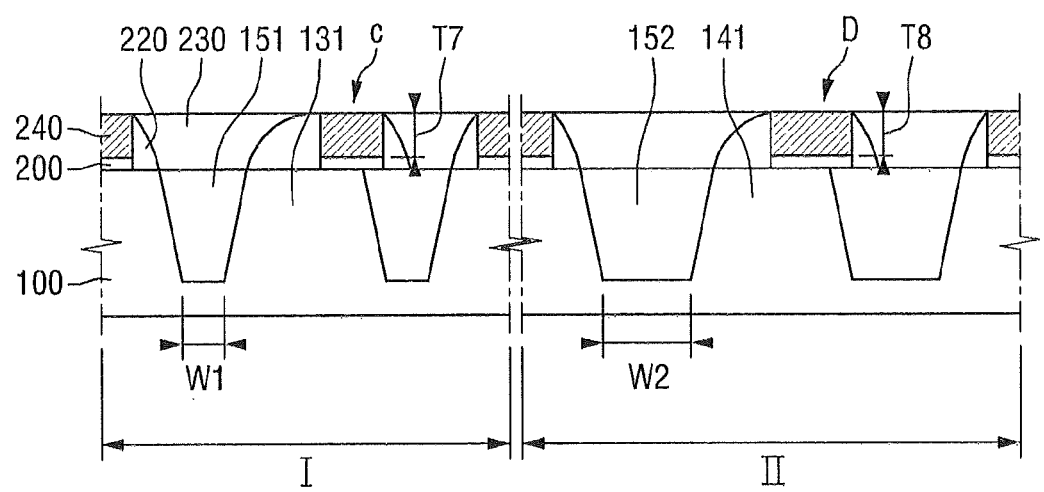
Figure 12:
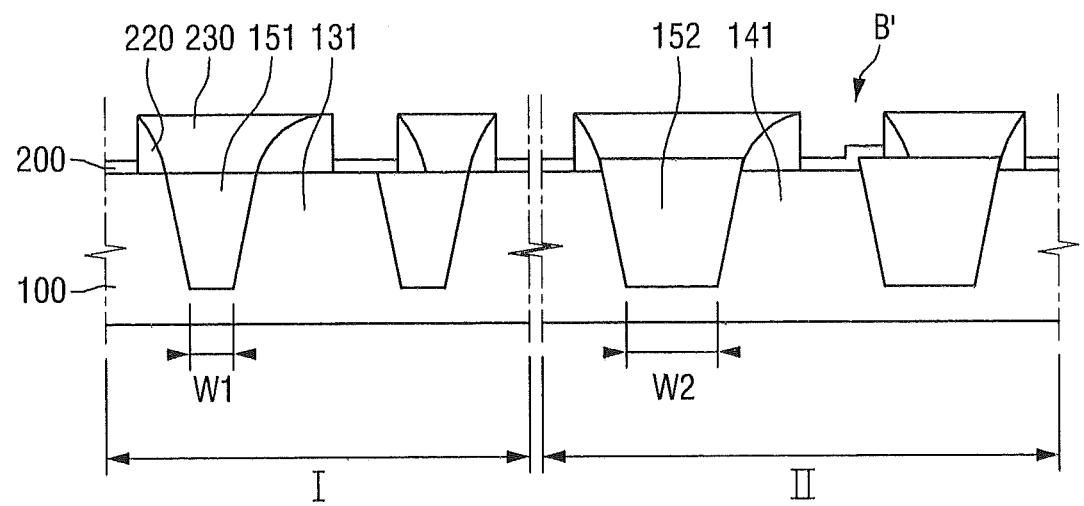

Next, referring to FIG. 10, the dummy gate (210 of FIG. 9) is removed to expose the gate insulation film 200. Referring to FIG. 11, a metal conductive film is formed on the exposed gate insulation film 200 and planarized to form a metal gate 240.

Here, a thickness T7 of the metal gate 240 formed on the active region 131 may be substantially the same as a thickness of the metal gate 240 formed on the first isolation film 151. In addition, a thickness T8 of the metal gate 240 formed on the active region 141 may be substantially the same as a thickness of the metal gate 240 formed on the second isolation film 152. That is, in the method for fabricating the semiconductor device according to the embodiment of the present invention, as described above, a step difference is not formed between the second isolation film 152 and the active region 141 adjacent thereto. Thus, the thickness T8 of the metal gate 240 formed on the active region 141 may be substantially the same as that of the metal gate 240 formed on the second isolation film 152. Therefore, the performance of a first transistor C or a second transistor D may be properly implemented, as intended to be designed.

However, unlike in the illustrated embodiment, if the second isolation film 152 has not been etched more than the first isolation film 151 through dry cleaning, a step difference is formed between the second isolation film 152 and the active region 141 adjacent thereto. Therefore, if the process steps shown in FIGS. 9 and 10 are performed in such a state, the resultant structure may have a shape shown in FIG. 12. That is to say, the gate insulation film 200 of a second dummy transistor B' may be formed stepwise due to the step difference between the active region 141 and the second isolation film 152.

Figure 13:
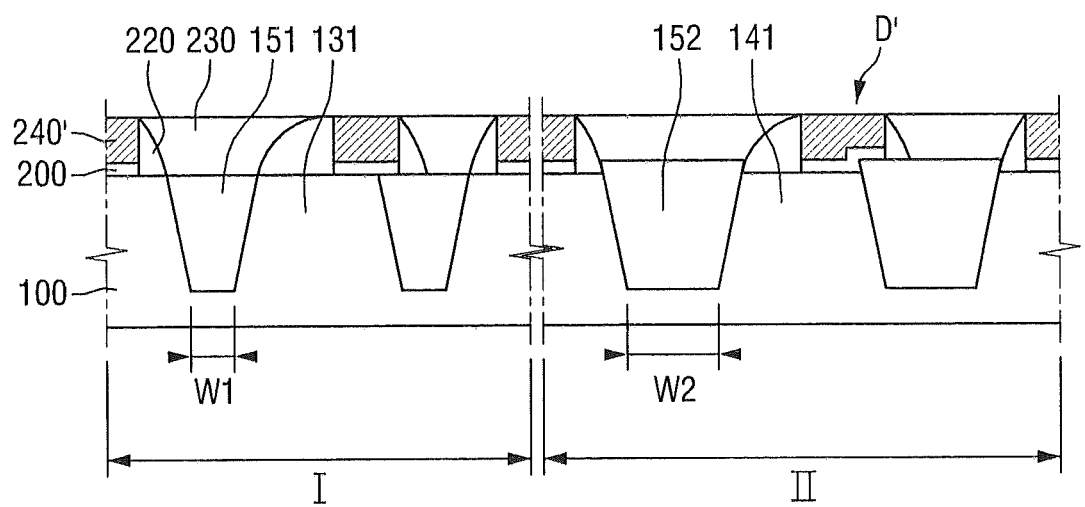

Here, as shown in FIG. 13, if a metal conductive film is formed and then planarized to form a metal gate 240', the metal gate 240' formed on the active region 141 and the metal gate 240' formed on the second isolation film 152 may have different thicknesses. If the metal gate 240' is not uniform in its thickness, and thus has an irregular thickness, the performance of the second transistor D' intended to be designed may not be properly implemented. Accordingly, the product reliability may be adversely affected.

Therefore, in the illustrated embodiment, the second isolation film 152 is etched more than the first isolation film 151 through dry cleaning in advance, thereby adjusting the thickness (T8 of FIG. 11) of the metal gate 240 formed on the active region 141 to be substantially the same as the thickness (T8 of FIG. 11) of the metal gate 240 formed on the second isolation film 152, and further enhancing the product reliability.

Next, a method for fabricating a semiconductor device according to another embodiment of the present invention will be described with reference to FIGS. 14 and 15.

Figure 14:
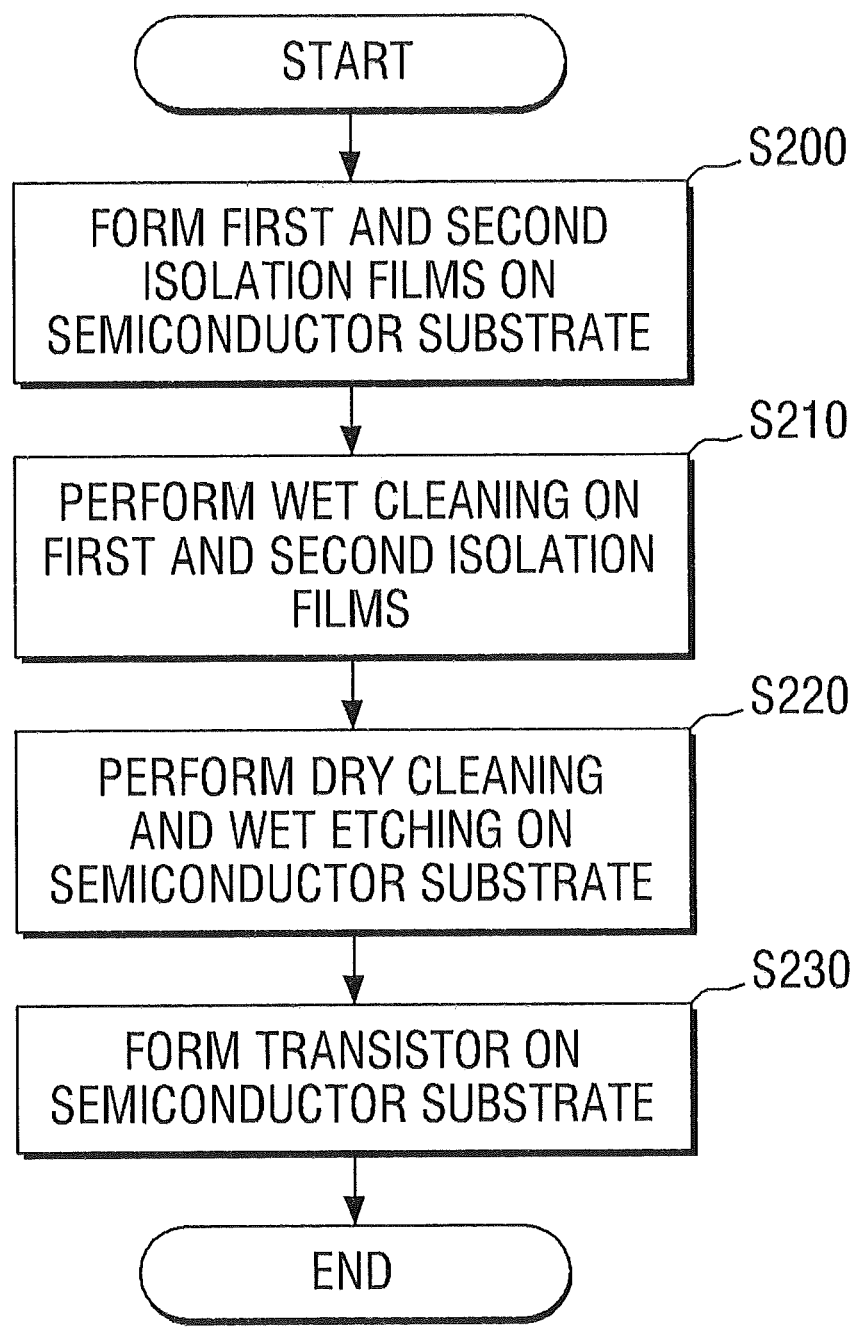
FIG. 14 is a flowchart of a method for fabricating a semiconductor device according to another embodiment of the present invention.
Figure 15:
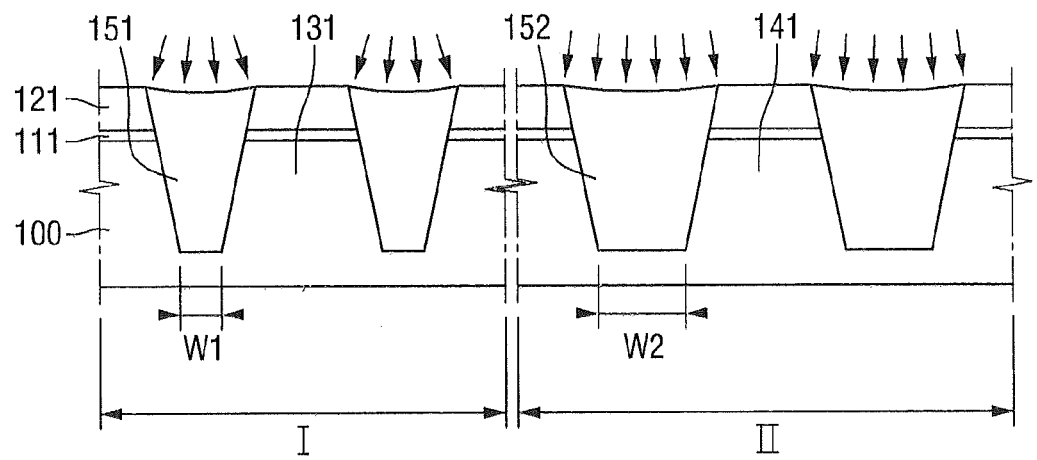
FIG. 15 illustrates intermediate process steps for explaining the method for fabricating a semiconductor device shown in FIG. 14.

FIG. 14 is a flowchart of a method for fabricating a semiconductor device according to another embodiment of the present invention, and FIG. 15 illustrates intermediate process steps for explaining the method for fabricating a semiconductor device shown in FIG. 14.

Referring to FIG. 14, first and second isolation films having different widths are formed on a semiconductor substrate (S200). Here, formation of the first and second isolation films (S200) has been fully described as above, and repeated explanations thereof will be omitted. The semiconductor substrate 100 having the first and second isolation films 151 and 152 will have the same structure as the semiconductor substrate 100 shown in FIG. 5.

Next, referring to FIG. 14, the first and second isolation films are wet etched (S210). In detail, referring to FIG. 15, the first and second isolation films 151 and 152 of the semiconductor substrate 100 shown in FIG. 5 are etched by wet etching using a HF solution. Through the etching process, a top surface area of the second isolation film 152 having a relatively larger width may be greater than a top surface area of the first isolation film 151 having a relatively small width. The top surface area of the second isolation film 152 is made to be greater than the top surface area of the first isolation film 151 for the purpose of further increasing an area of the second isolation film 152 exposed to reactant gases in a subsequent process. Accordingly, the second sacrificial film (157 of FIG. 6) having a relatively large thickness may be formed on the second isolation film 152.

Referring again to FIG. 14, the semiconductor substrate is dry cleaned and wet etched (S220). Then, a transistor is formed on the semiconductor substrate (S230). Since the subsequent fabrication processes can be practically the same as those fully described above, the descriptions thereof will be omitted.

Hereinafter, application examples of the semiconductor device according to embodiments of the present invention will be described. First, referring to FIGS. 16 through 18, a case where the semiconductor device fabricated according to embodiments of the present invention is a nonvolatile memory device will be described.

Figure 16:
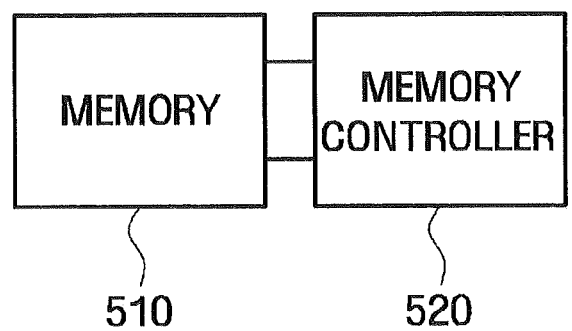
FIGS. 16 through 18 are diagrams illustrating exemplary uses of a nonvolatile memory device fabricated according to embodiments of the present invention.
Figure 17:
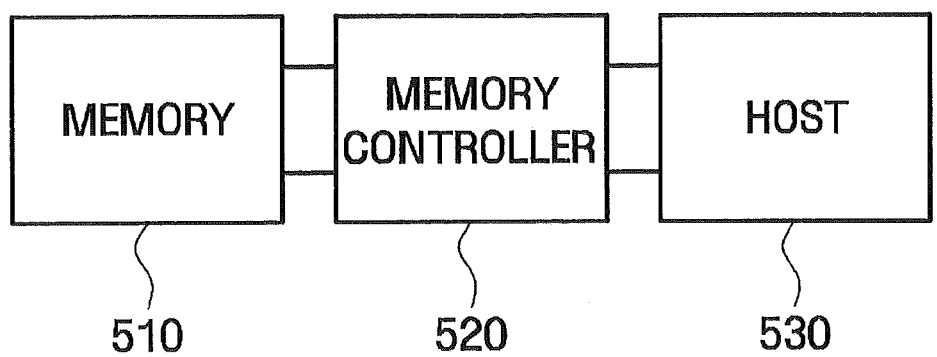
Figure 18:
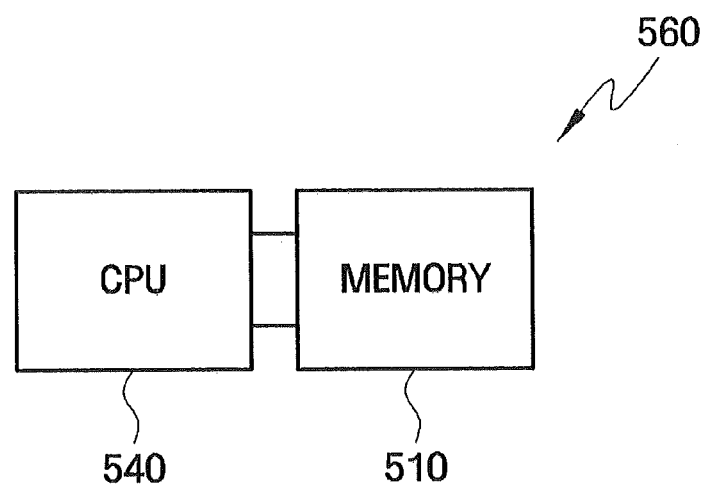

FIGS. 16 through 18 are diagrams illustrating examples of uses of a nonvolatile memory device fabricated according to embodiments of the present invention.

Referring to FIG. 16, a system comprises a memory 510 and a memory controller 520 connected to the memory 510. Here, the memory 510 may be a nonvolatile memory device fabricated according to the previously described embodiments of the inventive concept, and the memory controller 520 can provide input signals, which control operations of the memory 510. For example, the memory controller 520 can provide the memory 510 with command signals, which control read operation and write operation and address signals.

A system containing such memory 510 and the memory controller 520 can be embodied into a card such as memory card. Specifically, the system according to embodiments of the present invention can be embodied into an industry standard card used in electronics devices including cellular phones, two-way communication systems, one way pagers, two-way pagers, personal communication systems, portable computers, PDAs (Personal Data Assistances), audio and/or video players or recorders, digital and/or video cameras, navigation systems, and GPS (Global Positioning Systems). However, it is not limited thereto, and the system according to the exemplary embodiment of the inventive concept can be embodied into various devices including memory sticks.

Referring to FIG. 17, another system comprises a memory 510, a memory controller 520, and a host system 530. Here, the host system 530 is connected to the memory controller 520 through a bus and provides the memory controller 520 with a control signal to allow the memory controller 520 to control operations of the memory 510. Such host system 530 can be a processing system used in cellular phones, two-way communication systems, one way pagers, two-way pagers, personal communication systems, portable computers, PDAs (Personal Data Assistants), audio and/or video players or recorders, digital and/or video cameras, navigation systems, and GPS (Global Positioning Systems). Also, although FIG. 17 shows that the memory controller 520 is placed in between the memory 510 and the host system 530, it is not limited thereto. In other embodiments of the present invention, the memory controller 520 may be selectively omitted.

Referring to FIG. 18, still another system comprises a computer system 560 including a Central Processing Unit (CPU) 540 and a memory 510. In the computer system 560, the memory 510 may be directly connected to the CPU 540 or connected through typical computer bus architecture and can store an Operating System (OS) instruction set, a Basic Input/Output Start up (BIOS) instruction set, and an Advanced Configuration and Power Interface (ACPI) instruction set. Also, the memory 510 may be used as a mass storage device such as a Solid State Disk (SSD).

Meanwhile, for brevity, all components included in a computer system 560 are not illustrated in FIG. 18, but aspects of the present invention are not limited thereto. In addition, for brevity, forming of a memory controller 520 between a memory device 510 and a CPU 540 is not shown in FIG. 18, However, in still another embodiment of the present invention, the memory controller 520 may be formed between the memory device 510 and the CPU 540.

Next, a card incorporating a semiconductor device fabricated according to embodiments of the present invention will be described with reference to FIG. 19.

Figure 19:
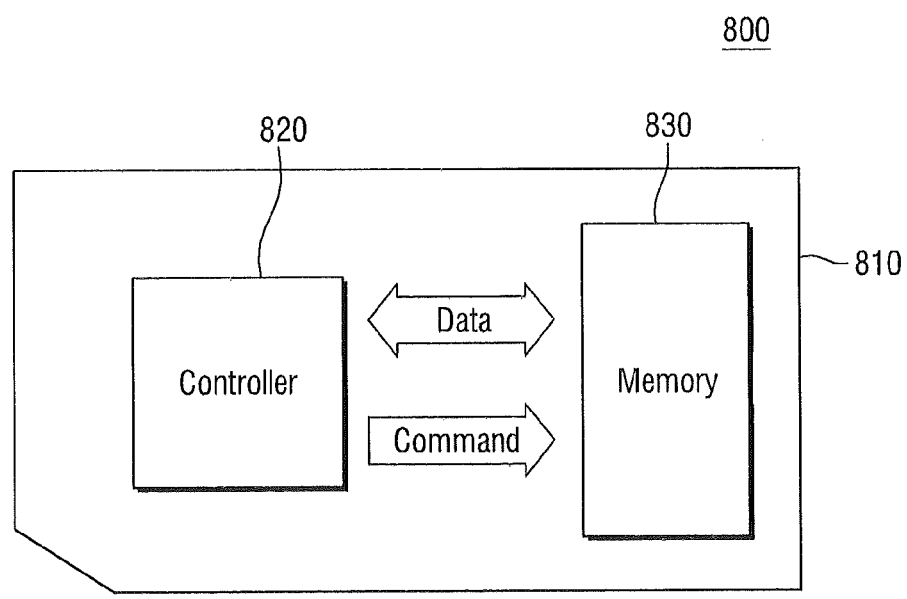
FIG. 19 is a schematic block diagram illustrating a memory card according to embodiments of the present invention.

FIG. 19 is a schematic block diagram illustrating a card according to embodiments of the present invention.

Referring to FIG. 19, a memory card 800 may include a controller 820 and a memory 830 provided in a housing 810. The controller 820 and the memory 830 may exchange electrical signals. For example, the controller 820 and the memory 830 may exchange data based on a command of the controller 820. Accordingly, the memory card 800 may store data in the memory 830 or may output the data from the memory 830 to an external device.

The controller 820 or the memory 830 may include a semiconductor device fabricated according to embodiments of the present invention. For example, the controller 820 may include a system in package, and the memory 830 may include a multi chip package. Alternatively, the controller 820 and/or the memory 830 may be provided as a stack package. The memory card 800 may be used as a data storage medium of a variety of portable devices. For example, the card 800 may be any of various cards such as a multimedia card (MMC), a secure digital (SD) card, and among other possibilities.

Next, an exemplary electronic system incorporating a semiconductor device fabricated according to embodiments of the present invention will be described with reference to FIGS. 20 and 21.

Figure 20:
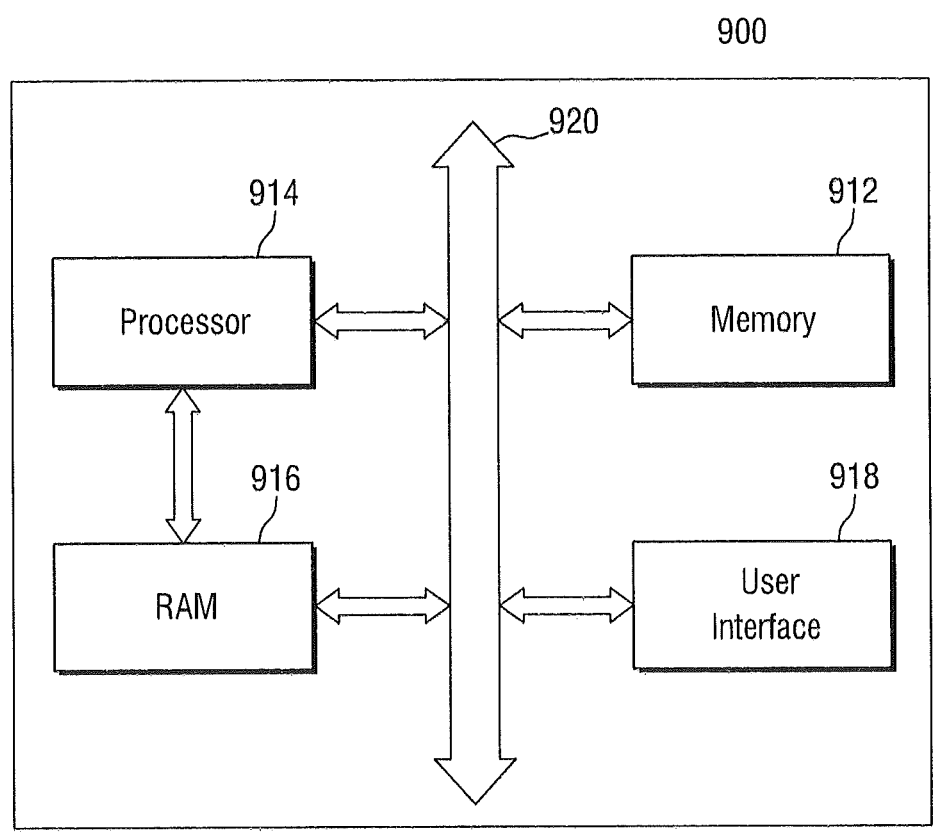
FIG. 20 is a block diagram illustrating an electronic system incorporating a semiconductor device fabricated according to embodiments of the present invention.
Figure 21:
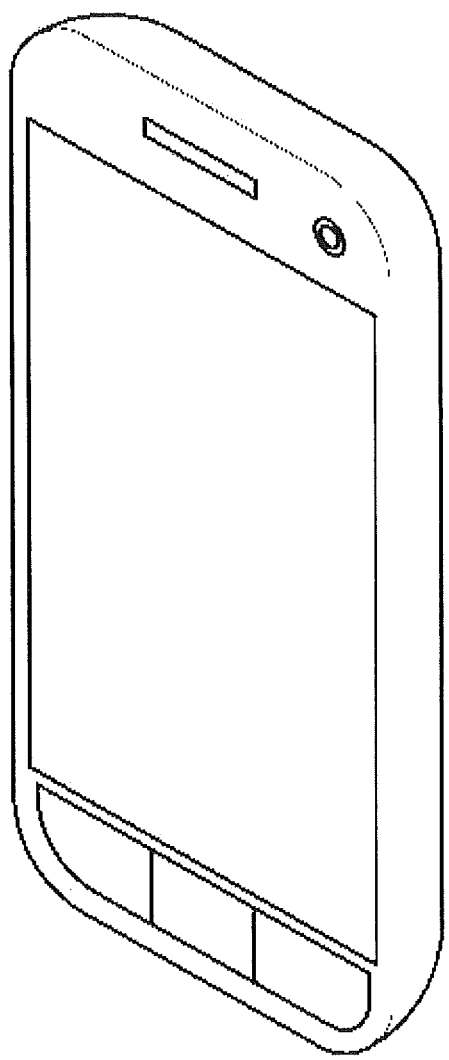
FIG. 21 is a diagram illustrating an exemplary electronic system used in a mobile phone.

FIG. 20 is a block diagram illustrating an electronic system incorporating a semiconductor device fabricated according to embodiments of the present invention, and FIG. 21 is a diagram illustrating an exemplary electronic system used in a mobile phone.

Referring to FIG. 20, the electronic system 900 may include a semiconductor device fabricated according to embodiments of the present invention. The electronic system 900 may include a mobile device or a computer. For example, the electronic system 900 may include a memory system 912, a processor 914, a RAM 916, and a user interface 918, which perform data communication using a bus 920. The processor 914 may execute a program and control the electronic system 900. The RAM 916 may be used as an operating memory of the processor 914. For example, the processor 914 and the RAM 916 may include a semiconductor device fabricated according to embodiments of the present invention. Alternatively, the processor 914 and the RAM 916 may be incorporated into a package. The user interface 918 may be used to input/output data to/from the electronic system 900. The memory system 912 may store codes for operating the processor 914, data processed by the processor 914 or externally input data. The memory system 912 may include a controller and a memory.

The electronic system 900 may be connected to electronic control devices of various electronic devices. Referring to FIG. 21, for example, the electronic system (900 of FIG. 20) may be used for a mobile phone 1000. In addition, the electronic system (900 of FIG. 20) may also be used for a portable notebook computer or other portable computing device, an MP3 player, a navigation system, a solid state disk (SSD), a household appliance, and so on.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method for fabricating a semiconductor device, the method comprising:
    forming a first isolation film having a first width and a second isolation film having a second width on a semiconductor substrate having a buffer oxide film pattern and a hard mask film pattern;
    isotropically etching the first and second isolation films by first and second thicknesses different from each other in the course of performing a dry cleaning process on the semiconductor substrate;
    etching the first and second isolation films by third and fourth thicknesses different from each other in the course of exposing an active region of the semiconductor substrate by removing the buffer oxide film pattern and the hard mask film pattern; and
    forming a metal gate on the exposed active region of the semiconductor substrate.

2. The method of claim 1, wherein performing the dry cleaning process on the semiconductor substrate comprises:
    injecting an etching gas, a catalytic gas and an inert gas into a chamber without a bias applied thereto;
    forming first and second sacrificial films having different thicknesses from each other on the first and second isolation films; and
    removing the first and second sacrificial films.

3. The method of claim 2, wherein the etching gas includes hydrogen fluoride (HF) gas, the catalytic gas includes ammonia ($NH_3$) gas, and the inert gas includes a nitrogen ($N_2$) or argon (Ar) gas.

4. The method of claim 2, wherein the thickness of the second sacrificial film is greater than the thickness of the first sacrificial film.

5. The method of claim 2, wherein the first and second sacrificial films include ammonium-silicon-fluoride.

6. The method of claim 2, wherein the forming of the first and second sacrificial films having different thicknesses from each other and removing the first and second sacrificial films are performed in-situ.

7. The method of claim 1, wherein the first and second isolation films include undoped silicate glass (USG) oxide films.

8. The method of claim 1, wherein the second width is greater than the first width, the second thickness is greater than the first thickness, and the fourth thickness is less than the third thickness.

9. The method of claim 1, wherein forming the metal gate on the exposed active region of the semiconductor substrate comprises:
    sequentially forming a gate insulation film and a dummy gate on the exposed active region of the semiconductor substrate;
    exposing the gate insulation film by removing the dummy gate; and
    forming the metal gate on the exposed gate insulation film.

10. The method of claim 1, wherein the dry cleaning process is repeated at least once.

* * * * *